United States Patent
Aharonov

(10) Patent No.: US 8,919,318 B2
(45) Date of Patent: Dec. 30, 2014

(54) GERMANIUM CONTAINING COATING FOR INNER SURFACES OF CYLINDER LINERS

(75) Inventor: Robert R. Aharonov, West Bloomfield, MI (US)

(73) Assignee: Federal-Mogul Corporation, Southfield, MI (US)

( * ) Notice: Subject to any disclaimer, the term of this patent is extended or adjusted under 35 U.S.C. 154(b) by 382 days.

(21) Appl. No.: 13/493,215

(22) Filed: Jun. 11, 2012

(65) Prior Publication Data

US 2012/0318228 A1 Dec. 20, 2012

Related U.S. Application Data

(60) Provisional application No. 61/497,290, filed on Jun. 15, 2011.

(51) Int. Cl.
*F02F 1/00* (2006.01)
*C23C 16/509* (2006.01)
*C23C 28/04* (2006.01)

(52) U.S. Cl.
CPC ............ *C23C 16/509* (2013.01); *C23C 28/044* (2013.01); *C23C 28/046* (2013.01); *C23C 28/048* (2013.01)
USPC .................................. 123/193.2; 427/255.35

(58) Field of Classification Search
CPC ....... F02F 1/004; C23C 14/086; C23C 16/24; C23C 16/26; C23C 16/22; C23C 16/32; C23C 16/30; C23C 16/407; C23C 28/00
USPC ....................... 123/193.2, 270, 272, 668, 669; 427/255.27, 255.35, 255.28, 248.1, 427/249.7, 249.8, 249.15, 589; 29/888.061
See application file for complete search history.

(56) References Cited

U.S. PATENT DOCUMENTS 4,783,369 A 11/1988 Sugata et al.
4,956,137 A 9/1990 Dwivedi
(Continued)

FOREIGN PATENT DOCUMENTS

WO 2011147808 A1 12/2011

OTHER PUBLICATIONS

Lusk et al., Thick DLC Films Deposited by PECVD on the Internal Surface of Cylindrical Substrates, Diamond and Related Materials, (2008).

(Continued)

*Primary Examiner* — Hung Q Nguyen
(74) *Attorney, Agent, or Firm* — Robert L. Stearns; Dickinson Wright, PLLC

(57) ABSTRACT

A cylinder liner (20) comprises a substrate (24) and a germanium containing coating (22), typically a diamond-like carbon (DLC) coating applied by a vapor deposition technique. The coating (22) may include a base layer (36), an intermediate layer (38), and a protective layer (40), each having a graded composition. The base layer (36) comprises, in weight percent (wt. %) of the base layer (36), 50.0 to 70.0 wt. % carbon, 30.0 to 50.0 wt. % silicon, and not greater than 20.0 wt. % germanium. The intermediate layer (38) comprises, in weight percent (wt. %) of the intermediate layer (38), 40.0 to 60.0 wt. % carbon, 15.0 to 35.0 wt. % silicon, and 15.0 to 35.0 wt. % germanium. The protective layer (40) includes, in weight percent (wt. %) of the protective layer (38), at least 90.0 wt. % carbon.

20 Claims, 3 Drawing Sheets

(56) References Cited

U.S. PATENT DOCUMENTS

| | | | |
|---|---|---|---|
| 4,974,498 A | 12/1990 | Lemelson | |
| 5,237,967 A | 8/1993 | Willermet et al. | |
| 5,249,554 A | 10/1993 | Tamor et al. | |
| 5,554,415 A | 9/1996 | Turchan et al. | |
| 5,648,127 A | 7/1997 | Turchan et al. | |
| 5,731,046 A | 3/1998 | Mistry et al. | |
| 5,732,046 A * | 3/1998 | O'Donnell et al. | 367/149 |
| 6,080,445 A | 6/2000 | Sugiyama et al. | |
| 6,086,796 A | 7/2000 | Brown et al. | |
| 6,087,025 A | 7/2000 | Dearnaley et al. | |
| 6,764,714 B2 | 7/2004 | Wei et al. | |
| 6,767,419 B1 | 7/2004 | Branagan | |
| 7,052,736 B2 | 5/2006 | Wei et al. | |
| 7,214,406 B2 | 5/2007 | Johnson et al. | |
| 7,306,778 B2 | 12/2007 | Chaffin | |
| 7,323,071 B1 | 1/2008 | Branagan | |
| 7,351,480 B2 | 4/2008 | Wei et al. | |
| 7,383,807 B2 | 6/2008 | Azevedo et al. | |
| 7,767,184 B2 | 8/2010 | Chaffin, III | |
| 7,771,823 B2 | 8/2010 | Chaffin | |
| 2005/0119136 A1 | 6/2005 | Castle | |
| 2008/0069972 A1 | 3/2008 | Chaffin | |
| 2009/0176035 A1 | 7/2009 | Tudhope et al. | |
| 2010/0098964 A1 * | 4/2010 | Ruebig | 428/547 |
| 2011/0044572 A1 | 2/2011 | Kano et al. | |

OTHER PUBLICATIONS

Boardman et al., Corrosion and Mechanical Properties of Diamond-like Carbon Films Deposited Inside Carbon Steel Pipes, (2007).

Lusk et al., A hollow cathode high density plasma process for internally coating cylindrical substrate, Proceedings of 17th International Conference on Pipeline Protection (2007).

Casserly et al., Investigation of DLC-Si Film Deposited Inside a 304SS Pipe Using a Novel Hollow Cathode Plasma Immersion Ion Processing Method, Society of Vacuum Coaters, (2007).

International Search Report PCT/US2012/041840 mailed Aug. 30, 2012.

* cited by examiner

GERMANIUM CONTAINING COATING FOR INNER SURFACES OF CYLINDER LINERS

CROSS REFERENCE TO RELATED APPLICATION

This application claims the benefit of U.S. provisional application Ser. No. 61/497,290 filed Jun. 15, 2011, which is incorporated herein by reference in its entirety.

BACKGROUND OF THE INVENTION

1. Field of the Invention

This invention relates generally to coated cylinder liners and methods of funning the same.

2. Description of the Prior Art

Cylinders of internal combustion engines often include a sleeve or liner providing an inner surface of the cylinder. The cylinder liner includes a substrate that can be fitted to the engine block to form the cylinder. The inner surface of the cylinder liner faces toward a piston and provides an interface or sliding surface for the piston or piston rings during operation of the internal combustion engine. Thus, the substrate of the cylinder liner is typically formed of a hard, wear resistant material. The cylinder liner is also preferably formed of a material capable of handling the extreme conditions encountered during a combustion cycle, including high temperatures and pressures. In attempt to improve wear resistance provided by the cylinder liner, coatings have been applied to the inner surface of the substrate. Examples of the wear resistant coatings include diamond-like carbon (DLC) coatings, such as those disclosed in U.S. Pat. No. 5,249,554 to Tamor et al.

SUMMARY OF THE INVENTION

One aspect of the invention provides a cylinder liner comprising a substrate and a coating. The substrate includes an inner surface extending around a center axis, and the coating is disposed on the inner surface of the substrate. The coating comprises a mixture of hydrogen, carbon, silicon, and germanium, and includes an intermediate layer and a protective layer. The intermediate layer includes, in weight percent (wt. %) of the intermediate layer, 40.0 to 60.0 wt. % carbon, 15.0 to 35.0 wt. % silicon, and 15.0 to 35.0 wt. % germanium. The protective layer includes, in weight percent (wt. %) of the protective layer, at least 90.0 wt. % carbon. The weight of the coating, or layer of the coating, does not include the weight of any hydrogen present in the coating or layer.

Another aspect of the invention provides a method of forming a cylinder liner. The method first includes providing a substrate including an inner surface extending around a center axis. The method next includes depositing a coating on the inner surface of the substrate. The depositing step includes applying a vapor containing carbon, silicon, and germanium to the substrate to form an intermediate layer of the coating, wherein the intermediate layer includes, in weight percent (wt. %) of the intermediate layer, 40.0 to 60.0 wt. % carbon, 15.0 to 35.0 wt. % silicon, and 15.0 to 35.0 wt. % germanium. The depositing step also includes applying a vapor containing carbon to the intermediate layer to form a protective layer of the coating, wherein the protective layer includes, in weight percent (wt. %) of the protective layer, at least 90.0 wt. % carbon.

The cylinder liner is typically used in internal combustion engines, wherein the coating of the cylinder liner provides an interface between a piston and the substrate to protect and prevent wear on the substrate. The composition and characteristics of the coating provide improved wear resistance and strength, compared to other coatings applied to cylinder liners, and thus improves the overall performance of the cylinder liner. Further, the coating is chemically inert and thus provides a barrier to sulfuric acid and other acids resulting from unburned fuels, especially in diesel engine applications.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION

Figure 1:
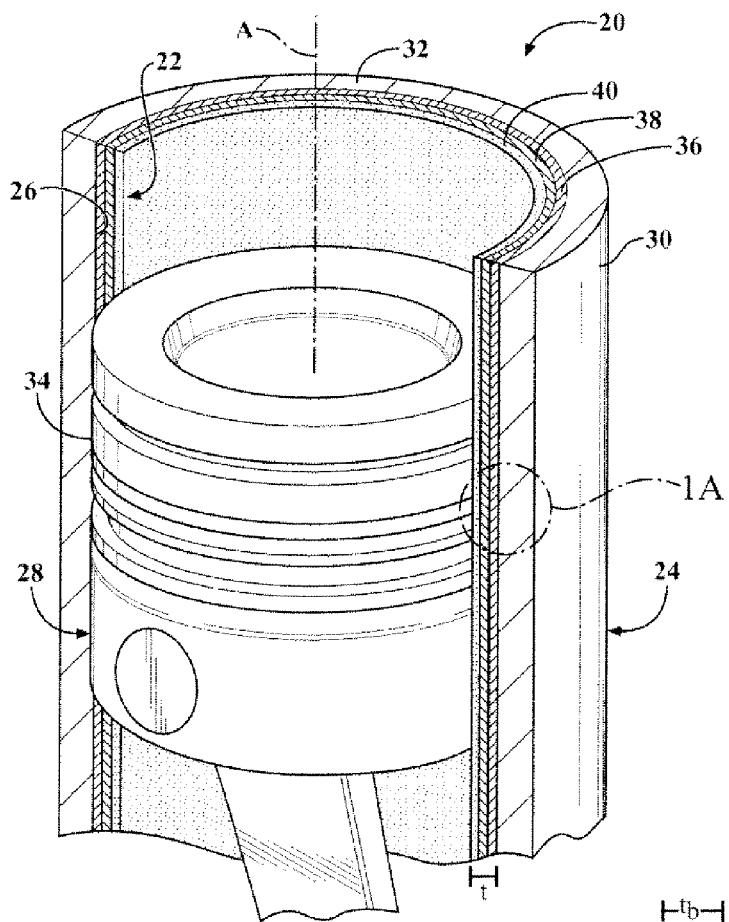
FIG. 1 is a perspective and partially cross-sectional view of a cylinder liner according to one embodiment of the invention.

One aspect of the invention provides a cylinder liner 20 of an internal combustion engine with a germanium containing coating 22 that provides improved wear resistance and strength during a combustion cycle. FIG. 1 shows the cylinder liner 20 according to one exemplary embodiment of the invention. The cylinder liner 20 may be fixed to an engine block (not shown) to provide a cylinder, or otherwise disposed to form the cylinder of the internal combustion engine.

The cylinder liner 20 includes a substrate 24 upon which the coating 22 is disposed. The substrate 24 includes an inner surface 26 facing and extending circumferentially around a center axis A and presenting a bore for receiving a piston 28 and providing a combustion chamber, as shown in FIG. 1. The inner surface 26 presents an inner diameter extending through the center axis A. During a combustion cycle and operation of the internal combustion engine, the inner surface 26 faces toward the piston 28, and the piston 28 reciprocates along the center axis A.

The substrate 24 of the cylinder liner 20 also includes an outer surface 30 facing opposite and parallel to the inner surface 26, a top surface 32 extending circumferentially around the center axis A, and a bottom surface (not shown) facing opposite and parallel to the top surface 32. The inner surface 26 and outer surface 30 are typically parallel to the center axis A, and the top surface 32 and the bottom surface each extend from the inner surface 26 to the outer surface 30 and are perpendicular to the center axis A.

The substrate 24 is formed of a metal material capable of providing a long service life under extreme conditions of the internal combustion engine during operation, such as high temperatures and pressures. Examples of materials used to form the substrate 24 include steel, cast iron, aluminum, and aluminum alloys. In one embodiment, the substrate 24 provides an exceptional hardness. The substrate 24 also has a high heat transfer coefficient such heat can be efficiently transferred from the combustion chamber to a coolant disposed outward of the outer surface 30.

The germanium containing coating 22 is disposed on the inner surface 26 of the substrate 24 and presents the innermost surface of the cylinder liner 20. The coating 22 provides an interface between the piston 28 and the substrate 24 to protect and prevent wear on the substrate 24. The coating 22 may also provide a sliding surface for the piston 28, or the piston rings 34, as shown in FIG. 1.

The coating 22 typically includes amorphous carbon, $sp^2$, and $sp^3$ hybridized carbon atoms and therefore is referred to as a diamond-like carbon (DLC). In this embodiment, the coating 22 is flexible and includes at least one property characteristic of a diamond. The coating 22 typically has a thickness t of not greater than 100 microns and includes multiple layers each having a thickness of not greater than 30 microns.

The coating 22 preferably comprises a mixture of carbon, silicon, germanium, and hydrogen. The coating 22 also preferably has a graded composition, meaning that the layers can have compositions different from one another, and that one or more of the layers can have a composition varying along the thickness of the layer. The weight of the coating, or layer of the coating, referred to throughout the present description, does not include the weight of any hydrogen present in the coating or layer.

Figure 1A:
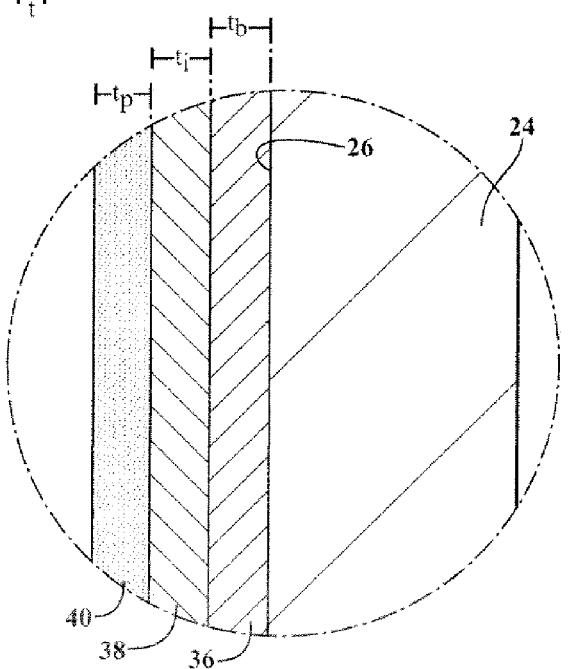
FIG. 1A is an enlarged cross-sectional view of the coating disposed on the substrate of the cylinder liner of FIG. 1.
Figure 4:
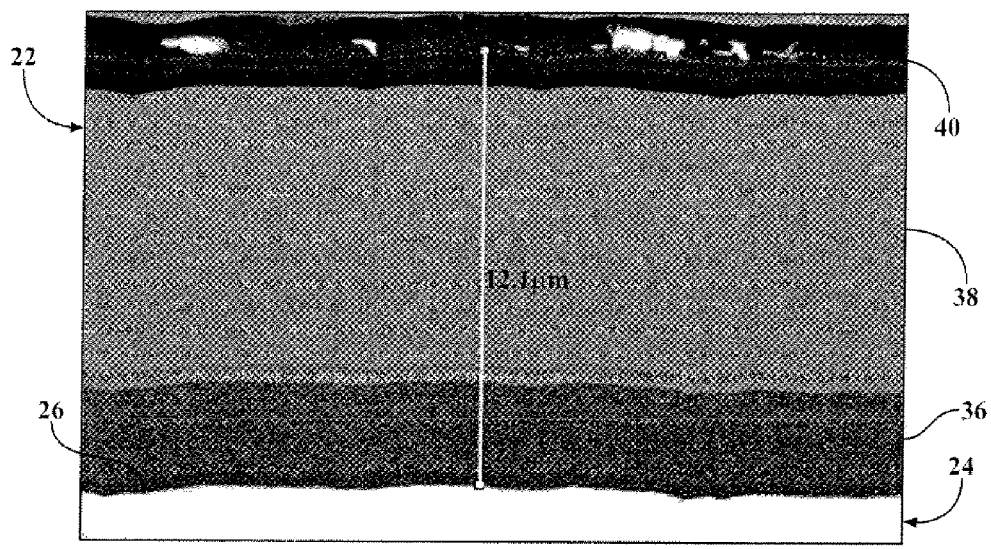
FIG. 4 is a photomicrograph of the coating of Example 2.

In one embodiment, the coating 22 includes a base layer 36 disposed directly on the inner surface 26 of the substrate 24, as shown in FIGS. 1, 1A, and 4. However, one or more other types of layers may be disposed between the base layer 36 and the substrate 24. The base layer 36 typically includes a mixture of carbon, silicon, and germanium. In one embodiment, the base layer 36 includes, in weight percent (wt. %) of the base layer 36, 50.0 to 70.0 wt. % carbon, 30.0 to 50.0 wt. % silicon, and not greater than 20.0 wt. % germanium. In another embodiment, the base layer 36 includes 55.0 to 65.0 wt. % carbon, 35.0 to 45.0 wt. % silicon, and not greater than 10.0 wt. % germanium. In yet another embodiment, the base layer 36 includes 60.0 to 65.0 wt. % carbon, 35.0 to 40.0 wt. %) silicon, and not greater than 1.0 wt. % germanium. In yet another embodiment, the base layer 36 includes 62.4 wt. % carbon, 38.0 wt. % silicon, and 0.0 wt. % germanium. Each disclosed range or amount of an element may be used in combination with any other disclosed range or amount of the other elements. The base layer 36 typically has a thickness $t_b$, as shown in FIG. 1A, of not greater than 30 microns. The composition of the base layer 36 may vary along the thickness $t_b$, relative to the distance from the inner surface 26 of the substrate 24.

The coating 22 also includes an intermediate layer 38, which may be disposed directly on the inner surface 26 of the substrate 24, directly on the base layer 36, or directly on another type of layer. The intermediate layer 38 typically includes a mixture of carbon, silicon, and germanium. In one embodiment, the intermediate layer 38 includes, in weight percent (wt. %) of the intermediate layer 38, 40.0 to 60.0 wt. % carbon, 15.0 to 35.0 wt. % silicon, and 15.0 to 35.0 wt. % germanium. In another embodiment, the intermediate layer 38 includes 45.0 to 55.0 wt. % carbon, 20.0 to 30.0 wt. % silicon, and 20.0 to 30.0 wt. % germanium. In yet another embodiment, the intermediate layer 38 includes 45.0 to 50.0 wt. % carbon, 25.0 to 30.0 wt. % silicon, and 20.0 to 25.0 wt. % germanium. In yet another embodiment, the intermediate layer 38 includes 49.8 wt. % carbon, 25.9 wt. % silicon, and 24.5 wt. % germanium. In yet another embodiment, the intermediate layer 38 includes 49.7 wt. % carbon, 26.0 wt. % silicon, and 24.6 wt. % germanium. Each disclosed range or amount of an element may be used in combination with any other disclosed range or amount of the other elements. The intermediate layer 38 typically has a thickness $t_i$, as shown in FIG. 1A, of not greater than 30 microns. The composition of the intermediate layer 38 may vary along the thickness $t_i$, relative to the distance from the inner surface 26 of the substrate 24.

The coating 22 also includes a protective layer 40, which may be disposed directly on the intermediate layer 38, or directly on another type of layer. In one embodiment, the protective layer 40 includes, in weight percent (wt. %) of the protective layer 40, at least 90.0 wt. % carbon, not greater than 10.0 wt. % silicon, and not greater than 10.0 wt. % germanium. In another embodiment, the protective layer 40 includes at least 95.0 wt. % carbon, not greater than 5.0 wt. % silicon, and not greater than 5.0 wt. % germanium. In yet another embodiment, the protective layer 40 includes 100.0 wt. % carbon. Each disclosed range or amount of an element may be used in combination with any other disclosed range or amount of the other elements. The protective layer 40 typically has a thickness $t_p$, as shown in FIG. 1A, of not greater than 30 microns. The composition of the protective layer 40 may vary along the thickness $t_p$, relative to the distance from the inner surface 26 of the substrate 24.

The protective layer 40 of the germanium containing coating 22 typically presents the innermost surface of the cylinder liner 20 and provides the interface between the piston 28 and the substrate 24. The protective layer 40 of the coating 22 may provide the sliding surface for the piston 28, or the piston rings 34, as shown in FIG. 1. In addition to providing wear resistance, the coating 22 is also chemically inert and thus provides a barrier to sulfuric acid and other acids resulting from unburned fuels, especially in diesel engine applications.

The coating 22 can include other types of layers in addition to the intermediate layer 38, protective layer 40, and optional base layer 36. Further, each layer of the coating 22 can include trace amounts of impurities or small amounts of other elements in addition to the carbon, silicon, and germanium.

Another aspect of the invention includes a method of forming the cylinder liner 20 with the germanium containing coating 22. The method includes applying the coating 22 to the inner surface 26 of the substrate 24, typically by a thermal spraying or vapor deposition technique. For example, the coating 22 may be deposited on the inner surface 26 of the substrate 24 by plasma-enhanced chemical vapor deposition (PECVD) and/or plasma-assisted chemical vapor deposition (PACVD) using a germanium containing gas as a precursor mixed with other hydrocarbon gases. In one embodiment, the depositing step includes employing a hollow-cathode discharge.

The method first includes providing the substrate 24 including the inner surface 26 facing and extending circumferentially around the center axis A; and then depositing a coating 22 on the inner surface 26 of the substrate 24. In one embodiment, the depositing step includes providing a vapor containing carbon, silicon, and germanium, and then applying the vapor to the substrate 24 to form the intermediate layer 38 of the coating 22, wherein the vapor and the intermediate layer 38 include, in weight percent (wt. %) of the vapor or intermediate layer 38, 40.0 to 60.0 wt. % carbon, 15.0 to 35.0 wt. % silicon, and 15.0 to 35.0 wt. % germanium. The depositing step may also include providing a vapor containing carbon, and applying the vapor to the intermediate layer 38 to form the protective layer 40 of the coating 22, wherein the vapor and the protective layer 40 include, in weight percent (wt. %) of the vapor or protective layer 40, at least 90.0 wt. % carbon.

In another embodiment, the depositing step further includes providing a vapor containing carbon and silicon, and applying the vapor to the substrate 24 to form the base layer 36, wherein the vapor and base layer 36 include, in weight percent (wt. %) of the vapor or base layer 36, 50.0 to 70.0 wt. % carbon, 30.0 to 50. wt. % silicon, and not greater than 20.0 wt. % germanium. The step of forming the base layer 36 is performed before applying the intermediate layer 38 and the protective layer 40 to the substrate 24.

EXAMPLE 1

In one exemplary embodiment, the coating 22 includes the intermediate layer 38 disposed directly on the inner surface 26 of the substrate 24 and the protective layer 40 disposed directly on the intermediate layer 38. The inter mediate layer 38 includes, in wt. % of the intermediate layer 38, 49.8 wt. % carbon, 25.9 wt. % silicon, and 24.5 wt. % germanium. The protective layer 40 includes 100.0 wt. % carbon. The weight of the layers does not include the weight of any hydrogen present in the layers.

Figure 2:
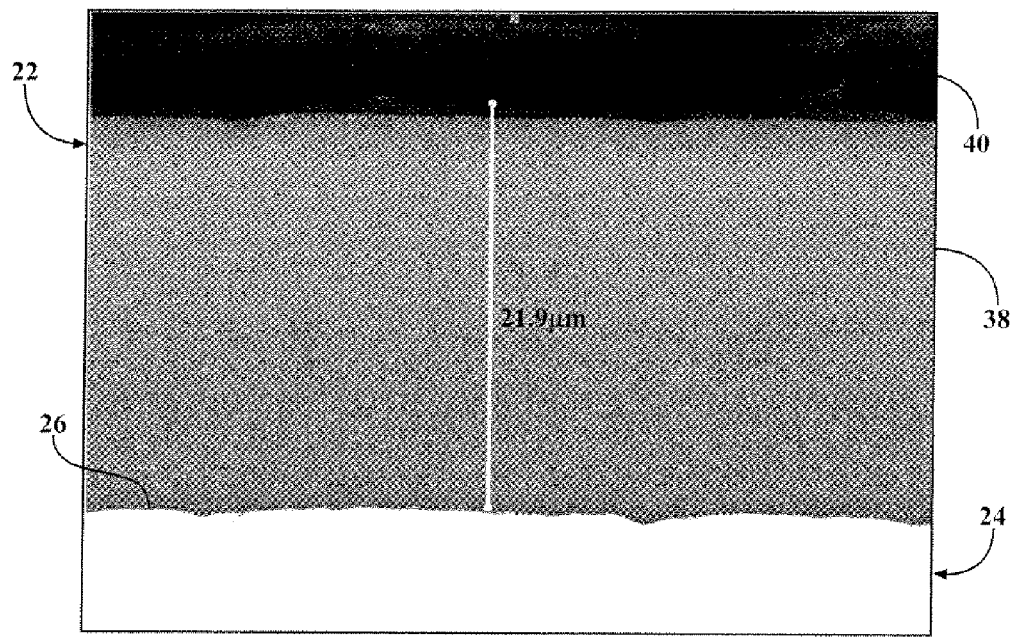
FIG. 2 is a photomicrograph of the coating of Example 1.
Figure 3:
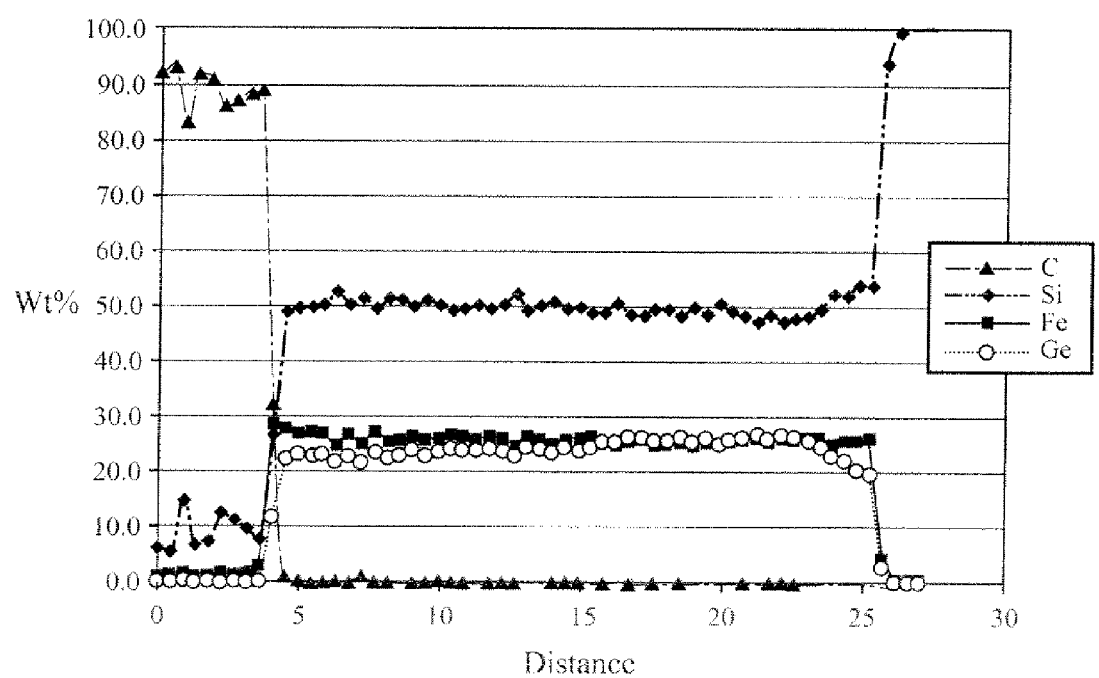
FIG. 3 is a line graph illustrating the composition of the coating of Example 1.

In this embodiment, there is no base layer 36 disposed between the intermediate layer 38 and the inner surface 26 of the substrate 24. FIG. 2 is a photomicrograph of the coating 22 of Example 1 disposed on the inner surface 26 of the substrate 24. The composition of the coating 22 varies relative to the distance from the inner surface 26 of the substrate 24. FIG. 3 is a line graph showing the composition of the coating 22 of Example 1 relative to the distance, in micrometers (μm), from the inner surface 26 of the substrate 24, wherein the inner surface 26 is at a distance of 0.

EXAMPLE 2

In another exemplary embodiment, the coating 22 includes the base layer 36 disposed directly on the inner surface 26 of the substrate 24, the inter mediate layer 38 disposed directly on the base layer 36, and the protective layer 40 disposed directly on the intermediate layer 38. The base layer 36 includes, in wt. % of the base layer 36, 62.4 wt. % carbon, 38.0 wt. % silicon, and 0.0 wt. % germanium. The intermediate layer 38 includes, in wt. % of the intermediate layer 38, 49.7 wt. % carbon, 26.0 wt. % silicon, and 24.6 wt. % germanium. The protective layer 40 includes 100.0 wt. % carbon. The weight of the layers does not include the weight of any hydrogen present in the layers.

Figure 5:
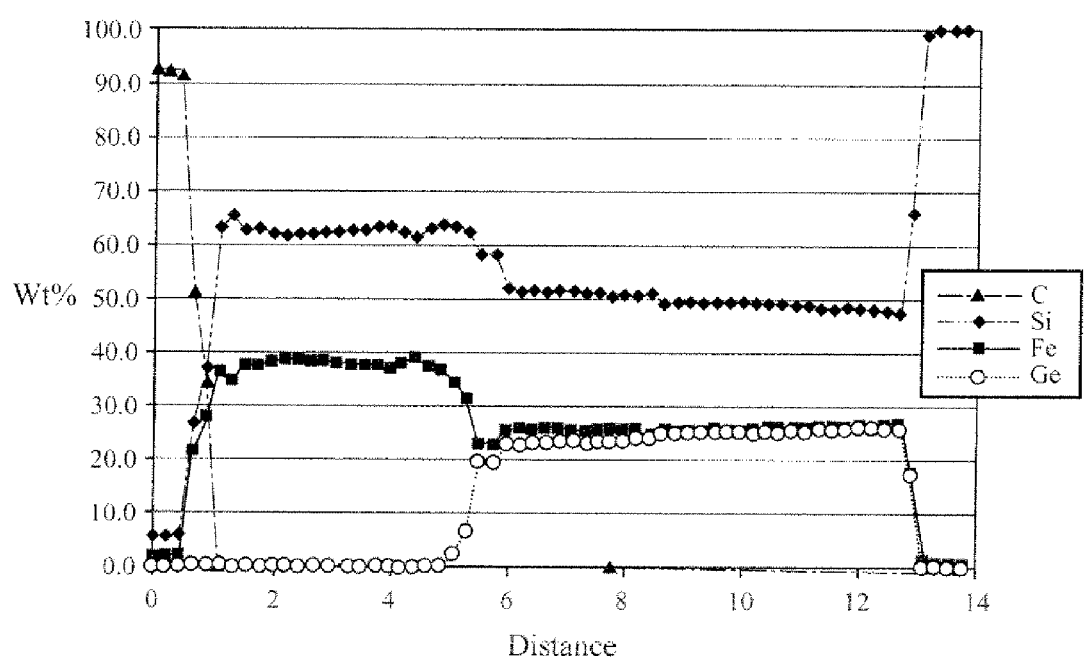
FIG. 5 is a line graph illustrating the composition of the coating of Example 2.

FIG. 4 is a photomicrograph of the coating 22 of Example 2 disposed on the inner surface 26 of the substrate 24. The composition of the coating 22 varies relative to the distance from the inner surface 26 of the substrate 24. FIG. 5 is a line graph showing the composition of the coating 22 of Example 2 relative to the distance, in micrometers (μm), from the inner surface 26 of the substrate 24, wherein the inner surface 26 is at a distance of 0.

Obviously, many modifications and variations of the present invention are possible in light of the above teachings and may be practiced otherwise than as specifically described while within the scope of the appended claims. In addition, the reference numerals in the claims are merely for convenience and are not to be read in any way as limiting.

What is claimed is:

1. A cylinder liner (20), comprising:
a substrate (24) including an inner surface (26) extending around a center axis (A);
a coating (22) disposed on said inner surface (26) of said substrate (24);
said coating (22) including an intermediate layer (38), said intermediate layer (38) comprising, in weight percent (wt. %) of said intermediate layer (38), 40.0 to 60.0 wt. % carbon, 15.0 to 35.0 wt. % silicon, and 15.0 to 35.0 wt. % germanium; and said coating (22) including a protective layer (40), said protective layer (40) including, in weight percent (wt. %) of said protective layer (38), at least 90.0 wt. % carbon, wherein the weight of said layers (38, 40) does not include the weight of any hydrogen present in said layers (38, 40).

2. The cylinder liner (20) of claim 1, wherein said coating (22) includes amorphous carbon, $sp^2$ and $sp^3$ hybridized carbon atoms.

3. The cylinder liner (20) of claim 1, wherein each of said layers (38, 40) of said coating (22) has a thickness ($t_i$, $t_p$) of not greater than 30 microns.

4. The cylinder liner (20) of claim 3, wherein at east one of said layers (38, 40) has a composition varying along said thickness ($t_i$, $t_p$).

5. The cylinder liner (20) of claim 1, wherein said coating (22) includes at least one property characteristic of a diamond.

6. The cylinder liner (20) of claim 1, wherein said intermediate layer (38) comprises 45.0 to 55.0 wt. % carbon, 20.0 to 30.0 wt. % silicon, and 20.0 to 30.0 wt. % germanium; and said protective layer (40) comprises at least 95.0 wt. % carbon.

7. The cylinder liner (20) of claim 1, wherein said intermediate layer (38) is disposed directly on said inner surface (26) of said substrate (24) and said protective layer (40) is disposed directly on said intermediate layer (38).

8. The cylinder liner (20) of claim 7, wherein said intermediate layer (38) comprises 49.8 wt. % carbon, 25.9 wt. % silicon, and 24.5 wt. % germanium; and said protective layer comprises 100.0 wt. % carbon.

9. The cylinder liner (20) of claim 1, wherein said coating (22) includes a base layer (36), said base layer (36) comprising, in weight percent (wt. %) of said base layer (36), 50.0 to 70.0 wt. % carbon, 30.0 to 50.0 wt. % silicon, and not greater than 20.0 wt. % germanium.

10. The cylinder liner (20) of claim 9, wherein said base layer (36) comprises 55.0 to 65.0 wt. % carbon, 35.0 to 45.0 wt. % silicon, and not greater than 10.0 wt. % germanium.

11. The cylinder liner (20) of claim 9, wherein said base layer (36) is disposed directly on said inner surface (26) of said substrate (24) and said intermediate layer (38) is disposed directly on said base layer (36).

12. The cylinder liner (20) of claim 11 wherein said base layer (36) comprises 62.4 wt. % carbon, 38.0 wt. % silicon, and 0.0 wt. % germanium; said intermediate layer (38) comprises 49.7 wt. % carbon, 26.0 wt. % silicon, and 24.6 wt. % germanium; and said protective layer (40) comprises 100.0 wt. % carbon.

13. A cylinder liner (20), comprising:
a substrate (24) including an inner surface (26) facing and extending circumferentially around a center axis (A) and presenting a bore for receiving a piston (28) and providing a combustion chamber;
said substrate (24) including an outer surface (30) facing opposite and parallel to said inner surface (26);
said substrate (24) including a top surface (32) extending circumferentially around said center axis (A) and extending from said inner surface (26) to said outer surface (30);
said substrate (24) formed of a metal material, said metal material comprising at least one of a steel, cast iron; aluminum, and aluminum alloy;
a coating (22) disposed on said inner surface (26) of said substrate (24) and presenting an innermost surface of said cylinder liner (20);

said coating (22) including amorphous carbon, $sp^2$, and $sp^3$ hybridized carbon atoms;

said coating (22) including at least one property characteristic of a diamond;

said coating (22) including a mixture of carbon, silicon, germanium, and hydrogen;

said coating (22) including an intermediate layer (38) disposed along said inner surface (26) of said substrate (24);

said intermediate layer (38) including, in weight percent (wt. %) of said intermediate layer (38), 40.0 to 60.0 wt. % carbon, 15.0 to 35.0 wt. % silicon, and 15.0 to 35.0 wt. % germanium, wherein the weight of said intermediate layer (38) does not include the weight of any hydrogen present in said intermediate layer (38);

said intermediate layer (38) having a thickness ($t_i$) of not greater than 30 microns;

said intermediate layer (38) having a composition varying along said thickness ($t_i$);

said coating (22) including a protective layer (40) disposed over said intermediate layer (38);

said protective layer (40) including, in weight percent (wt. %) of said protective layer (40), at least 90.0 wt. % carbon, wherein the weight of said protective layer (40) does not include the weight of any hydrogen present in said protective layer (40); and said protective layer (40) having a thickness ($t_p$) of not greater than 30 microns.

14. The cylinder liner (20) of claim 13 wherein said intermediate layer (38) includes 45.0 to 50.0 wt. % carbon, 25.0 to 30.0 wt. % silicon, and 20.0 to 25.0 wt. % germanium; and said protective layer (40) includes at least 95.0 wt. % carbon.

15. The cylinder liner (20) of claim 13 wherein said coating (22) includes a base layer (36) disposed between said inner surface (26) of said substrate (24) and said intermediate layer (38);

said base layer (36) including, in weight percent (wt. %) of said base layer (36), 50.0 to 70.0 wt. % carbon, 30.0 to 50.0 wt. % silicon, and not greater than 20.0 wt. % germanium;

said base layer (36) having a thickness ($t_b$) of not greater than 30 microns; and said base layer (36) having a composition varying along said thickness ($t_b$).

16. The cylinder liner (20) of claim 13 wherein said intermediate layer (38) includes 45.0 to 50.0 wt. % carbon, 25.0 to 30.0 wt. % silicon, and 20.0 to 25.0 wt. % germanium; said protective layer (40) includes at least 95.0 wt. % carbon; and said base layer (36) includes 60.0 to 65.0 wt. % carbon, 35.0 to 40.0 wt. % silicon, and not greater than 5.0 wt. % germanium.

17. A method of forming a cylinder liner (20) comprising, providing a substrate (24) including an inner surface (26) extending around a center axis (A);

depositing a coating (22) on the inner surface (26) of the substrate (24);

the depositing step including applying a vapor containing carbon, silicon, and germanium to the substrate (24) to form an intermediate layer (38) of the coating (22), wherein the intermediate layer (38) includes, in weight percent (wt. %) of the intermediate layer (38), 40.0 to 60.0 wt. % carbon, 15.0 to 35.0 wt. % silicon, and 15.0 to 35.0 wt. % germanium;

the depositing step including applying a vapor containing carbon to the intermediate layer (38) to form a protective layer (40) of the coating (22), wherein the protective layer (40) includes, in weight percent (wt. %) of the protective layer (40), at least 90 wt. % carbon, wherein the weight of the layers (38, 40) does not include the weight of any hydrogen present in the layers (38, 40).

18. The method of claim 17, wherein the depositing step further includes applying a vapor containing carbon and silicon to the substrate (24) to form a base layer (36) before applying the intermediate layer (38), wherein the base layer (36) includes, in weight percent (wt. %) of the base layer (36), 50.0 to 70.0 wt. % carbon, 30.0 to 50. wt. % silicon, and not greater than 20.0 wt. % germanium.

19. The method of claim 17, wherein the depositing step includes at least one of plasma-enhanced chemical vapor deposition (PACVD) and plasma-assisted chemical vapor deposition (PACVD).

20. The method of 17, wherein the depositing step includes employing a hollow-cathode discharge.

* * * * *